United States Patent
Miller et al.

(10) Patent No.: US 10,942,796 B2
(45) Date of Patent: Mar. 9, 2021

(54) IDENTIFYING ASYNCHRONOUS POWER LOSS

(71) Applicant: MICRON TECHNOLOGY, INC., Boise, ID (US)

(72) Inventors: Michael G. Miller, Boise, ID (US); Ashutosh Malshe, Fremont, CA (US); Violante Moschiano, Avezzano (IT); Peter Feeley, Boise, ID (US); Gary F. Besinga, Boise, ID (US); Sampath K. Ratnam, Boise, ID (US); Walter Di-Francesco, Silvi (IT); Renato C. Padilla, Jr., Boise, ID (US); Yun Li, San Jose, CA (US); Kishore Kumar Muchherla, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/544,190

(22) Filed: Aug. 19, 2019

(65) Prior Publication Data
US 2019/0370099 A1   Dec. 5, 2019

Related U.S. Application Data

(63) Continuation of application No. 16/178,963, filed on Nov. 2, 2018, now Pat. No. 10,430,262, which is a
(Continued)

(51) Int. Cl.
*G11C 11/34* (2006.01)
*G06F 11/07* (2006.01)
(Continued)

(52) U.S. Cl.
CPC .......... *G06F 11/073* (2013.01); *G06F 3/0619* (2013.01); *G06F 3/0659* (2013.01);
(Continued)

(58) Field of Classification Search
CPC .... G06F 3/0619; G06F 3/0659; G06F 3/0679; G06F 11/0751; G06F 11/079
(Continued)

(56) References Cited

U.S. PATENT DOCUMENTS

| 5,519,831 A | 5/1996 | Holzhammer |
|---|---|---|
| 6,170,066 B1 | 1/2001 | See |

(Continued)

OTHER PUBLICATIONS

Western Digital, "The Art of SSD Power Fail Protection: WD SiliconDrive Technologies Protect Critical areas of the Drive" White Paper, Jan. 2013, pp. 1-3.

*Primary Examiner* — Xiaochun L Chen
(74) *Attorney, Agent, or Firm* — Dicke, Billig & Czaja, PLLC

(57) ABSTRACT

Apparatus having an array of memory cells include a controller configured to read a particular memory cell of a last written page of memory cells of a block of memory cells of the array of memory cells, determine whether a threshold voltage of the particular memory cell is less than a particular voltage level, and mark the last written page of memory cells as affected by power loss during a programming operation of the last written page of memory cells when the threshold voltage of the particular memory cell is determined to be higher than the particular voltage level.

20 Claims, 12 Drawing Sheets

Related U.S. Application Data continuation of application No. 15/911,490, filed on Mar. 5, 2018, now Pat. No. 10,303,535, which is a continuation of application No. 15/390,833, filed on Dec. 27, 2016, now Pat. No. 9,921,898.

(51) Int. Cl.
*G06F 3/06* (2006.01)
*G06F 11/10* (2006.01)
*G11C 11/56* (2006.01)
*G11C 16/10* (2006.01)
*G11C 16/22* (2006.01)
*G11C 16/30* (2006.01)
*G11C 16/34* (2006.01)
*G11C 5/14* (2006.01)

(52) U.S. Cl.
CPC .......... *G06F 3/0679* (2013.01); *G06F 11/079* (2013.01); *G06F 11/0751* (2013.01); *G06F 11/0772* (2013.01); *G06F 11/1068* (2013.01); *G11C 11/5628* (2013.01); *G11C 16/10* (2013.01); *G11C 16/225* (2013.01); *G11C 16/30* (2013.01); *G11C 16/3459* (2013.01); *G11C 5/144* (2013.01)

(58) Field of Classification Search
USPC .................................................. 365/189.011
See application file for complete search history.

(56) References Cited

U.S. PATENT DOCUMENTS

| | | |
|---|---|---|
| 7,085,167 B2 * | 8/2006 | Lee ...................... G11C 16/225 365/185.17 |
| 8,289,801 B2 | 10/2012 | Smith et al. |
| 8,661,301 B1 | 2/2014 | Yen |
| 9,262,335 B2 | 2/2016 | Chen et al. |
| 9,367,417 B2 | 6/2016 | Jung et al. |
| 9,659,658 B2 | 5/2017 | Kim |
| 2006/0062049 A1 | 3/2006 | Lee et al. |
| 2006/0227624 A1 | 10/2006 | Shiga |
| 2009/0049334 A1 | 2/2009 | Elliott et al. |
| 2009/0109786 A1 | 4/2009 | Ye et al. |
| 2011/0058440 A1 | 3/2011 | Smith et al. |
| 2014/0250273 A1 | 9/2014 | Chen et al. |
| 2015/0113342 A1 | 4/2015 | Jung et al. |
| 2015/0332770 A1 | 11/2015 | Kim |
| 2016/0118143 A1 | 4/2016 | Muchherla et al. |

\* cited by examiner

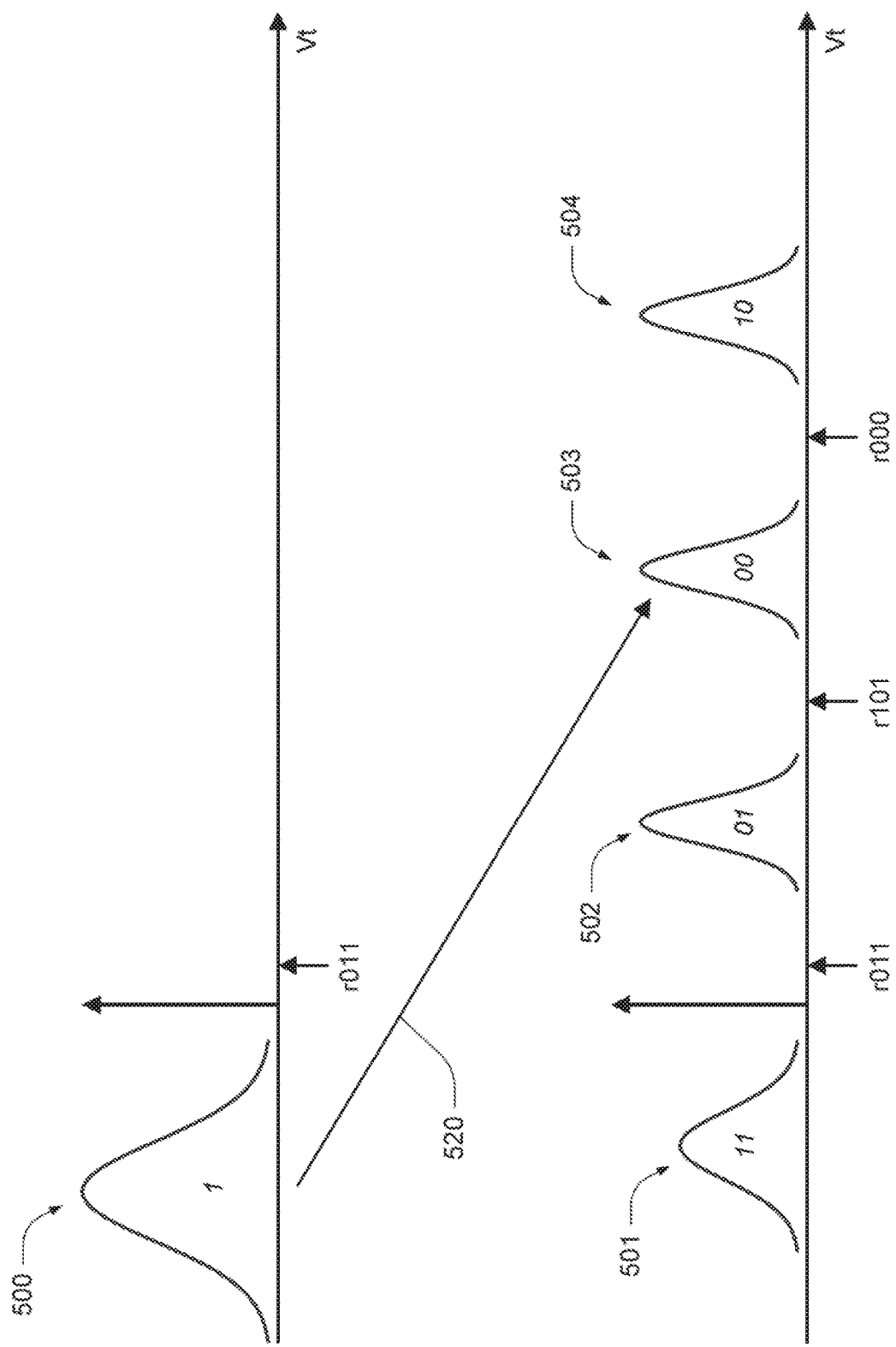

IDENTIFYING ASYNCHRONOUS POWER LOSS

RELATED APPLICATION

This application is a Continuation of U.S. application ser. No. 16/178,963, titled "IDENTIFYING ASYNCHRONOUS POWER LOSS," filed Nov. 2, 2018, now U.S Pat. No. 10,430,262, issued on Oct. 1, 2019, which is a Continuation of U.S. application Ser. No. 15/911,490, titled "IDENTIFYING ASYNCHRONOUS POWER LOSS," filed Mar. 5, 2018, now U.S. Pat. No. 10,303,535, issued on May 28, 2019, which is a Continuation of U.S. application Ser. No. 15/390,833, titled "IDENTIFYING ASYNCHRONOUS POWER LOSS," filed Dec. 27, 2016, now U.S. Pat. No. 9,921,898, issued on Mar. 20, 2018, which are commonly assigned and incorporated herein by reference.

TECHNICAL FIELD

The present disclosure relates generally to memory and, in particular, in one or more embodiments, the present disclosure relates to apparatus and methods to identify asynchronous power loss.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). MLC uses more than two Vt ranges, where each Vt range indicates a different data state. Multiple-level cells can take advantage of the analog nature of a traditional charge storage cell by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data and the UP data may be programmed to the memory cells in a first pass, resulting in four threshold voltage ranges, followed by the XP data (and, possibly, reprogramming of the UP data) in a second pass, resulting in eight threshold voltage ranges.

In each pass, programming typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

Due to the nature of flash memory devices, the physical location within a flash memory device for a given logical address will generally change over time. To address this changing correspondence, a Flash Translation Layer (FTL) is typically used to map the logical address to the physical address to which data has been stored. Although this high-level mapping information is often held in volatile memory for ease of use during operation of the memory device, such mapping information may also be periodically stored to non-volatile memory so that it may be retrieved during start-up of the device. Alternatively, this mapping information may be updated to non-volatile storage with each programming operation. If a memory device is powered down abruptly or otherwise loses power in an uncontrolled manner, e.g., asynchronous power loss, the most recent mapping information, as well as user data, may be invalid.

BRIEF DESCRIPTION OF THE DRAWINGS

FIGS. 5A-5B depict representations of populations of memory cells at various stages of a programming operation according to an embodiment.

DETAILED DESCRIPTION

Figure 1A:
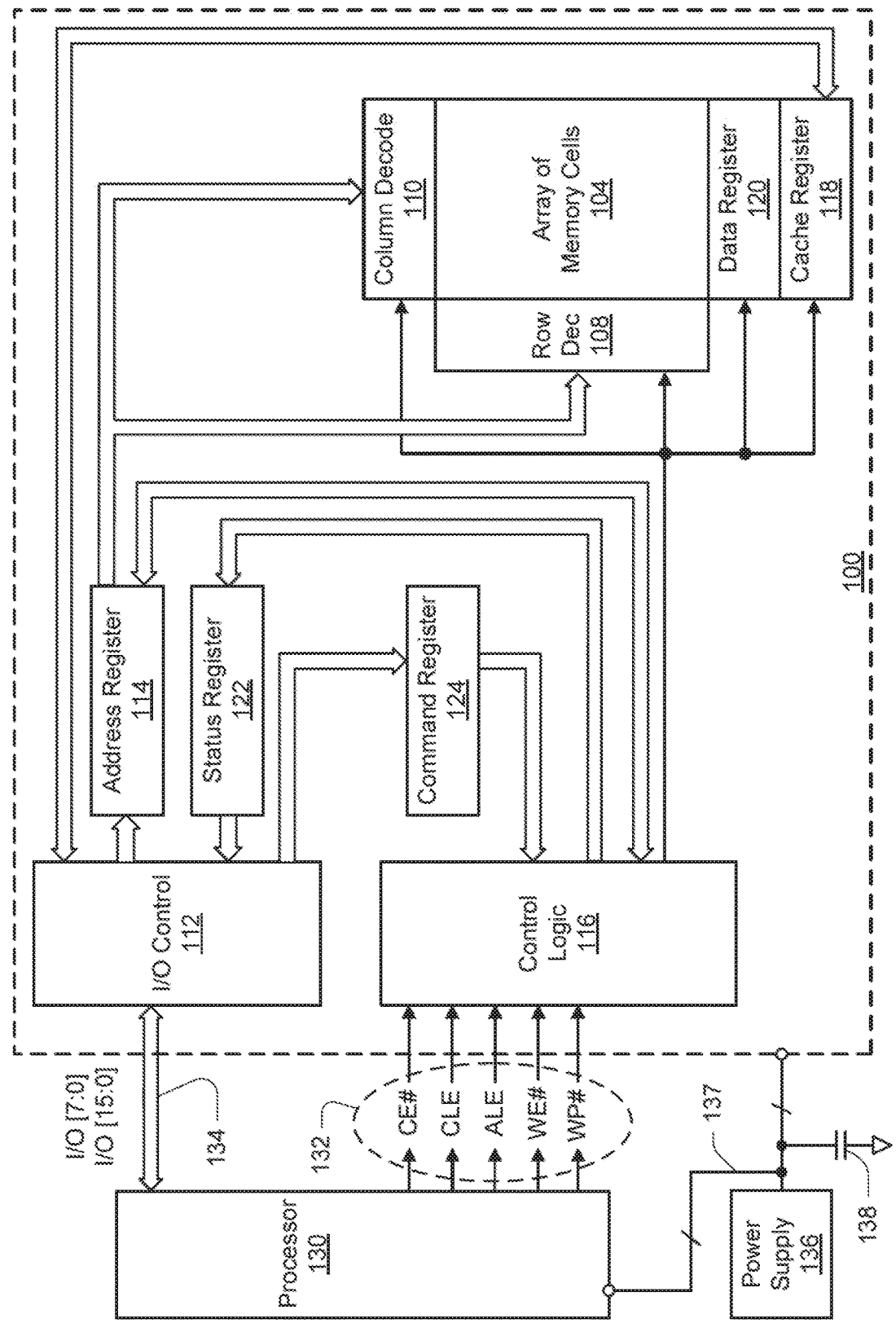
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

If an apparatus detects that a connected or component memory has suffered an uncontrolled shut-down, such as by reading a system flag at power-up of the memory, the apparatus may seek to detect whether a power loss occurred during a programming operation. Current algorithms used for such power-loss detection rely on margin reads and error handling routines. For example, when power loss is suspected, an algorithm may cause the memory device to read all pages to determine the last written page of memory cells in a block of memory cells. This last written page of memory cells may then be checked to determine if a power loss occurred during programming. This can be determined by adding a positive or negative offset to one or more read voltages prior to initiating a read on the questionable page of memory cells, a process referred to as a margin read. These margin reads might be performed in one read operation or multiple read operations on the same page of memory cells. Differentiating between power loss during a programming operation versus merely a data retention issue may be accomplished by applying a negative offset to the read voltage for the data state corresponding to at least the highest range of threshold voltages. If, after performing this margin read, error handling routines are unable to recover the data from the questionable page, that page of memory cells and its data are deemed to be affected by power loss.

Such algorithms, e.g., both margin read and error handling algorithms, used for detection generally become increasingly complex as the number of bits per memory cell increase. This can detrimentally impact power-up performance of the memory, as well as increase firmware complexity and cost. Furthermore, this process may be repeated in response to multiple power-loss events, even for pages of memory cells that were previously determined to be affected by power loss.

In addition, in solid state drives (SSDs), blocks of memory cells from multiple memories are often logically combined into a super block, e.g., a block of memory cells from each respective memory device. In older SSDs, when a block of memory cells was determined to be affected by power loss, its super block was queued for garbage collection, meaning that good data from the super block would be transferred to a new super block, and the super block containing the affected page of memory cells would be marked as intended for later erase and reuse, even if it contained a large amount of unused capacity. Without such treatment, an affected block of memory cells might have to be subjected to the detection and error correction algorithms in response to each power loss event. As super blocks become larger and fewer, this premature queuing of a super block for garbage collection removes larger amounts of memory from immediate availability, and may cause the SSD to go into write protect or have poor performance during the recovery process. It may thus be desirable to avoid queuing a super block for garbage collection when usable pages of memory cells are still available.

Various embodiments seek to identify pages of memory cells affected by power loss, and to mark such pages of memory cells for future tracking. By changing a desired data state of a memory cell of a group of memory cells being programmed when a power loss is detected, a value may be stored within that group of memory cells that can indicate the power loss without requiring any margin read operations. This can facilitate improvements in the time required to recover from a power loss event.

FIG. 1A is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may represent a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1A) of at least a portion of array of memory cells 104 are arranged in strings of series-connected memory cells.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform access operations (e.g., programming operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, a write enable WE#, and a write protect WP#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Memory device 100 and/or processor 130 may receive power from the power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two.

Power is typically received from the power supply 136 using two or more voltage supply nodes 137, such as a supply voltage node (e.g., Vcc) and a reference voltage node (e.g., Vss or ground). It is not uncommon for a power supply 136 to provide more than two voltage supply nodes 137. For example, a common standard for switched-mode power supplies, ATX (Advanced Technology eXtended) 2.x, provides, using a 28-pin connection, four voltage supply nodes (or pins) at +3.3V, five voltage supply nodes at +5V, four voltage supply nodes at +12V, one voltage supply node at 12V, and ten voltage supply nodes at a reference voltage (e.g., 0V). The ATX 2.x standard further provides a power-on node for activating the foregoing voltage supply nodes when it is pulled to ground by an external circuit, a standby voltage supply node driven to +5V regardless of whether the other voltage supply nodes are being driven to their respective voltage levels (which can be used to power the external circuit responsible for pulling the power-on node to ground), and a power-good node for indicating when the other voltage supply nodes are stabilized at their respective voltages. The remaining pin of the ATX 2.x 28-pin standard is undefined. Memory device 100 and processor 130 may utilize differing combinations of voltage supply nodes 137 from power supply 136 depending upon their respective power needs. For simplicity, distribution of power from the voltage supply nodes 137 to components within the memory device 100 is not depicted.

The voltage supply nodes 137, or other components of the electronic system, may have an inherent or added energy storage device, such as capacitance 138, e.g., a hold-up capacitance, that can provide power to the memory device 100, and optionally to the processor 130, for some finite amount of time in the case of failure or removal of the power supply 136. Sizing of the capacitance 138 can be readily determined based on the power requirements of at least the memory device 100 for the operations described herein. While the energy storage device is depicted as the capacitance 138 in examples herein, the capacitance 138 could alternatively represent a battery. Furthermore, while the capacitance 138 is depicted to be external to the memory device 100, it could alternatively be an internal component of the memory device 100.

It will be appreciated by those skilled in the art that additional circuitry and signals can be provided, and that the memory device 100 of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
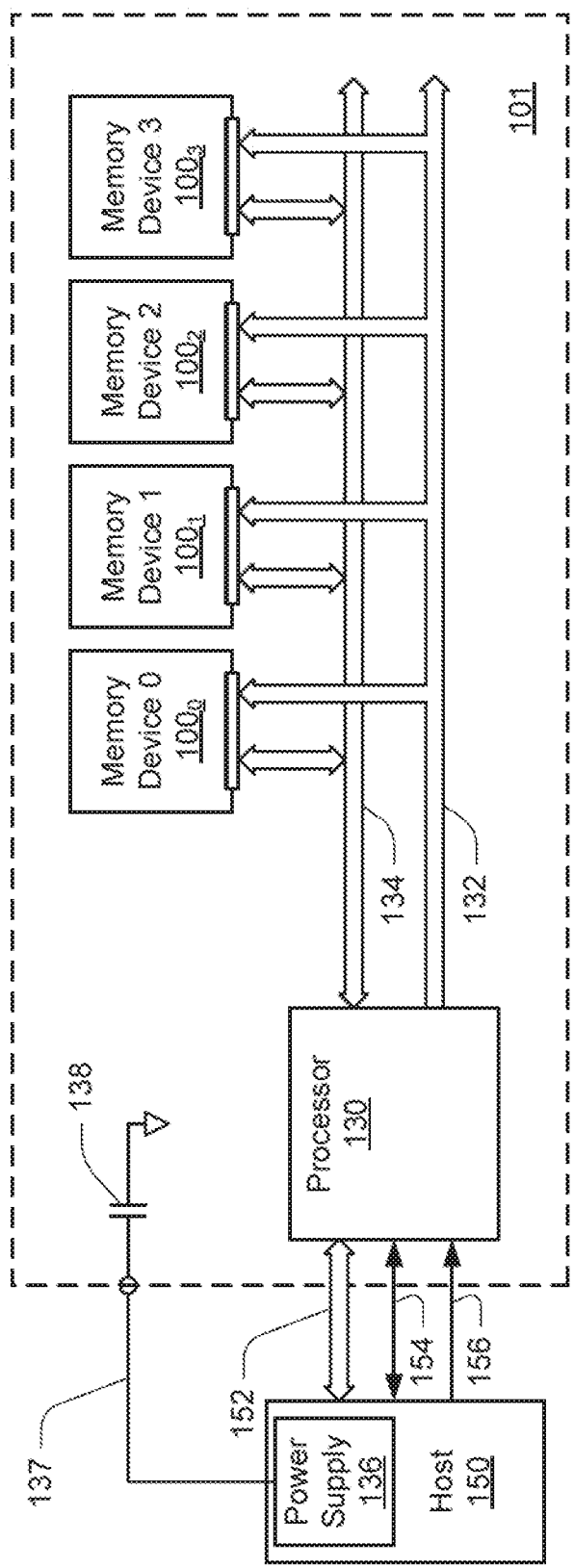
FIG. 1B is a simplified block diagram of an apparatus in the form of a memory module in communication with a host as part of an electronic system, according to another embodiment.

A given processor 130 may be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, I/O bus 134, power supply 136, voltage supply nodes 137 and capacitance 138 may be as described with reference to FIG. 1A. For simplicity, distribution of power from the voltage supply nodes 137 to the memory devices 100 and processor 130 within the memory module 101 is not depicted. Although memory module (e.g., package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 may involve different communication links than those used between the processor 130 and the memory devices 100. For example, the memory module 101 may be an Embedded MultiMediaCard (eMMC) of a solid state drive (SSD). In accordance with existing standards, communication with an eMMC may include a data link 152 for transfer of data (e.g., an 8-bit link), a command link 154 for transfer of commands and device initialization, and a clock link 156 providing a clock signal for synchronizing the transfers on the data link 152 and command link 154. The processor 130 may handle many activities autonomously, such as power-loss detection, error correction, management of defective blocks, wear leveling and address translation.

Figure 2A:
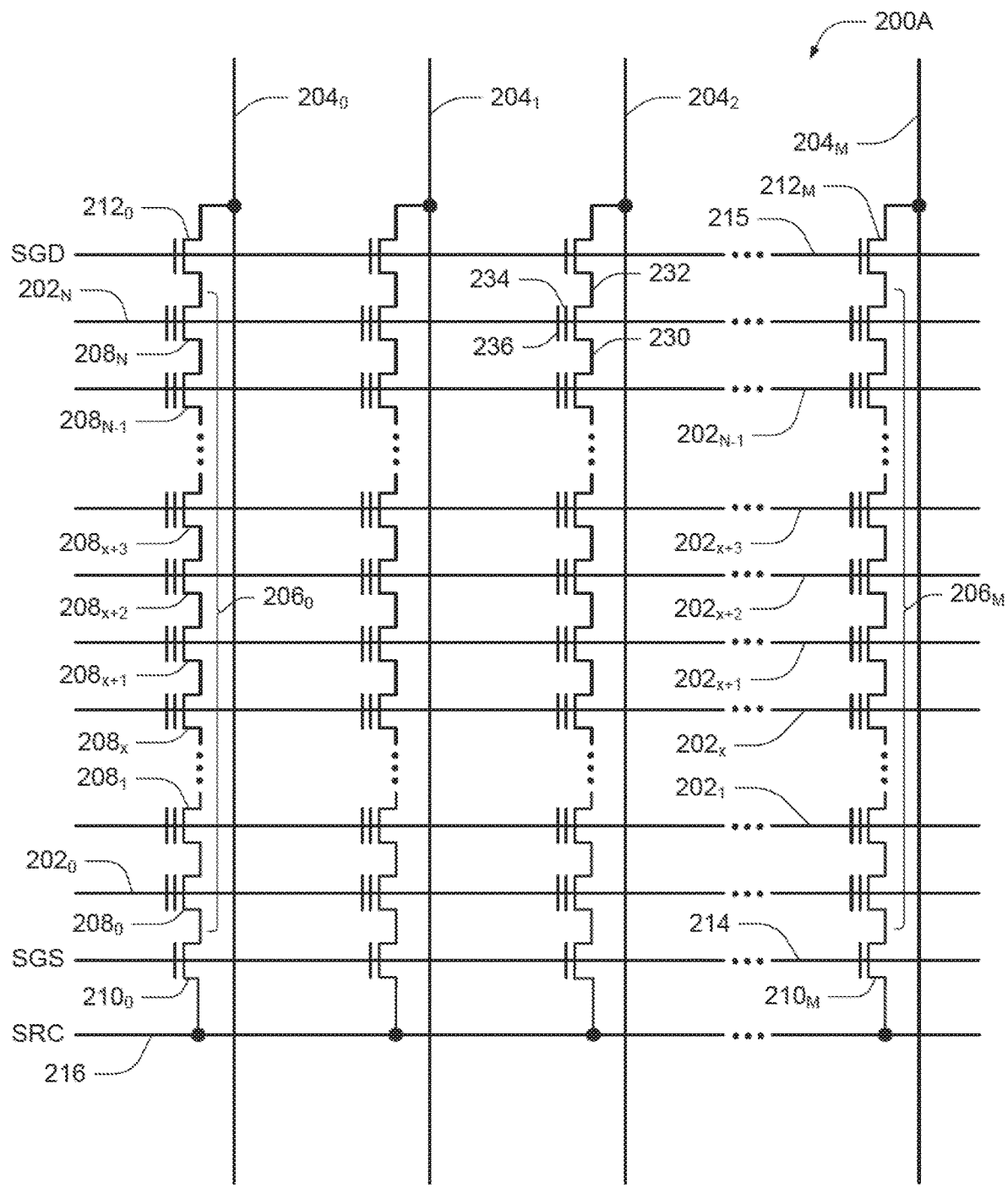
FIGS. 2A-2C are schematics of portions of an array of memory cells as could be used in a memory of the type described with reference to FIG. 1A.

FIG. 2A is a schematic of a portion of an array of memory cells 200A as could be used in a memory of the type described with reference to FIG. 1A, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
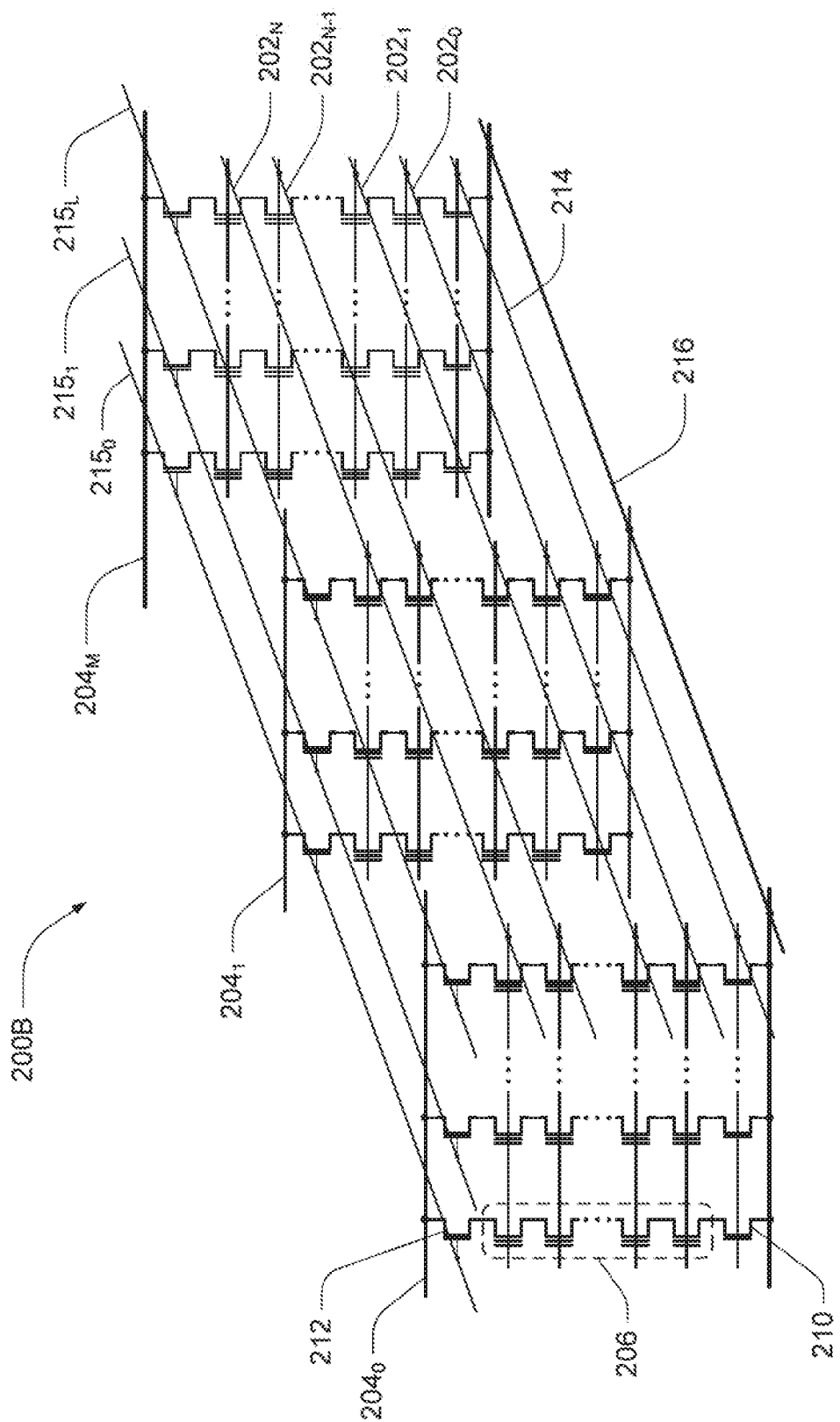

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
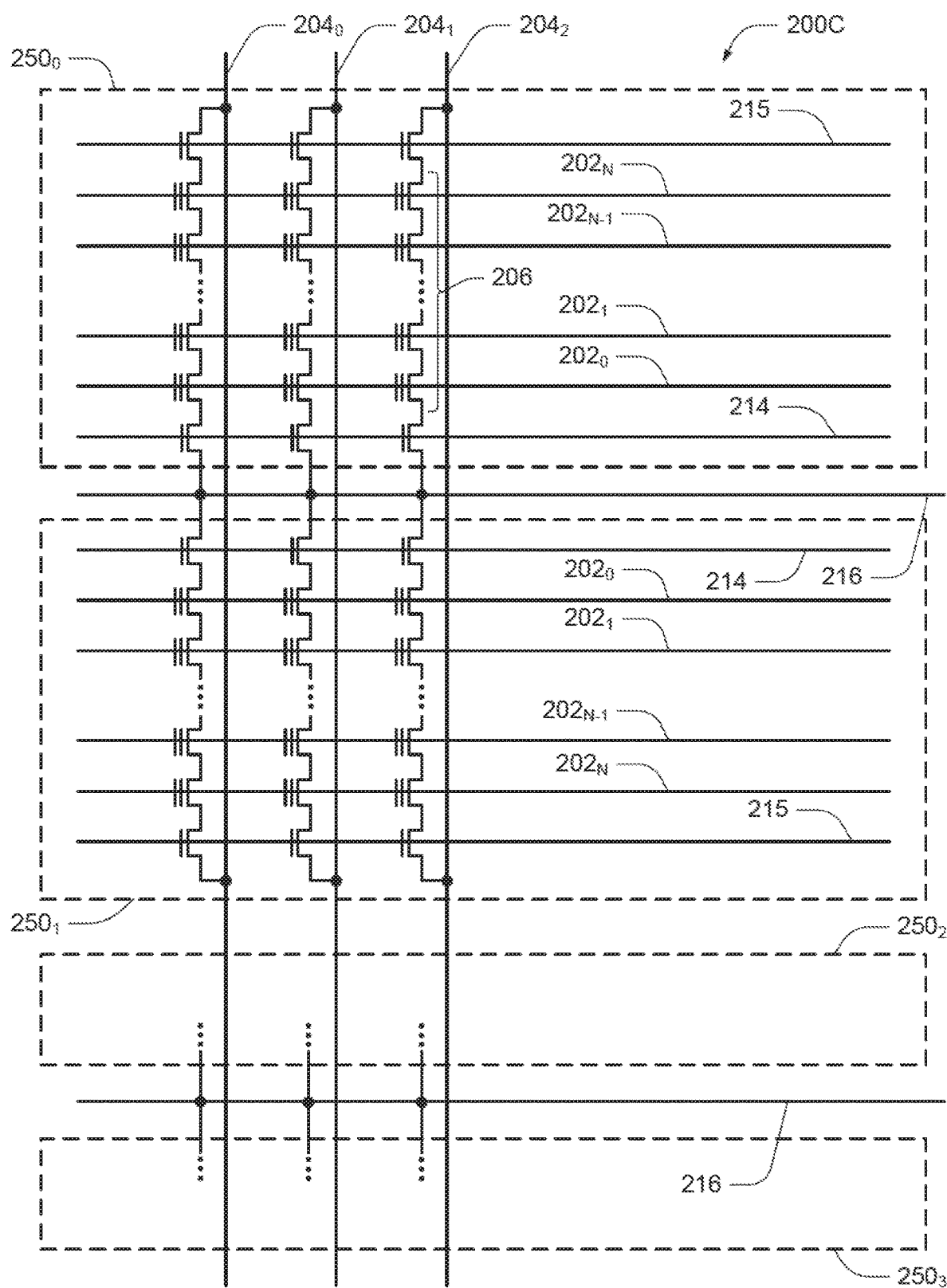

FIG. 2C is a further schematic of a portion of an array of memory cells 200C as could be used in a memory of the type described with reference to FIG. 1A, e.g., as a portion of array of memory cells 104. Like numbered elements in FIG. 2C correspond to the description as provided with respect to FIG. 2A. Array of memory cells 200C may include NAND strings 206, word lines 202, bit lines 204, source select lines 214, drain select lines 215 and common source 216 as depicted in FIG. 2A. The array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks.

Figure 3:
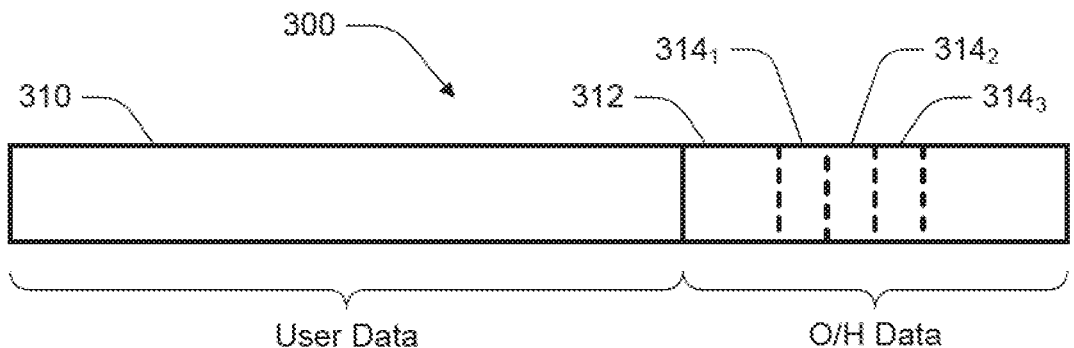
FIG. 3 is a representation of a page of memory cells for use with embodiments.

FIG. 3 is a representation of a page of memory cells 300 for use with embodiments. The page of memory cells 300 is a group of memory cells that may be programmed concurrently during a single programming operation. For example, the page of memory cells 300 might include all or a subset of memory cells (e.g., memory cells 208 of FIG. 2A) connected to an access line (e.g., access line 2021 of FIG. 2A).

The page of memory cells 300 includes a group of memory cells 310 configured for storage of user data, e.g., memory cells addressable for storage of user data. User data might include data received in association with a write command received by the memory to initiate a programming operation. The page of memory cells 300 further includes a group of memory cells 312 configured for storage of overhead data (sometimes referred to as metadata), e.g., memory cells addressable for storage of overhead data. Overhead data might include data generated by the memory in response to a write command received by the memory. For example, overhead data might include status indicators, error correction code data, mapping information and the like. For example, status indicators might include one or more flags 314, such as might be used for tracking progress of a programming operation. While the group of memory cells 310 and the group of memory cells 312 are each depicted to be single contiguous groups of memory cells, memory cells of the group of memory cells 310 might be interposed between memory cells of the group of memory cells 312, and vice versa, such that the group of memory cells 310 and/or the group of memory cells 312 may be non-contiguous groups of memory cells.

With reference back to FIG. 1B, host 150 might transmit a write command and associated data to the memory module 101, indicating a desire to store the associated data to the memory module 101. The processor 130 might then transmit a write command to the memory devices 100, indicating a desire to store the associated data to one or more of the memory devices 100 in a group of memory cells (e.g., of a page of memory cells) designated for storage of user data. The processor 130 might further generate error correction code data for the user data, as well as one or more flags or other overhead data to be stored to a group of memory cells (e.g., of the page of memory cells) designated for storage of overhead data concurrently with the storage of the user data to the group of memory cells designated for storage of user data.

Figure 4:
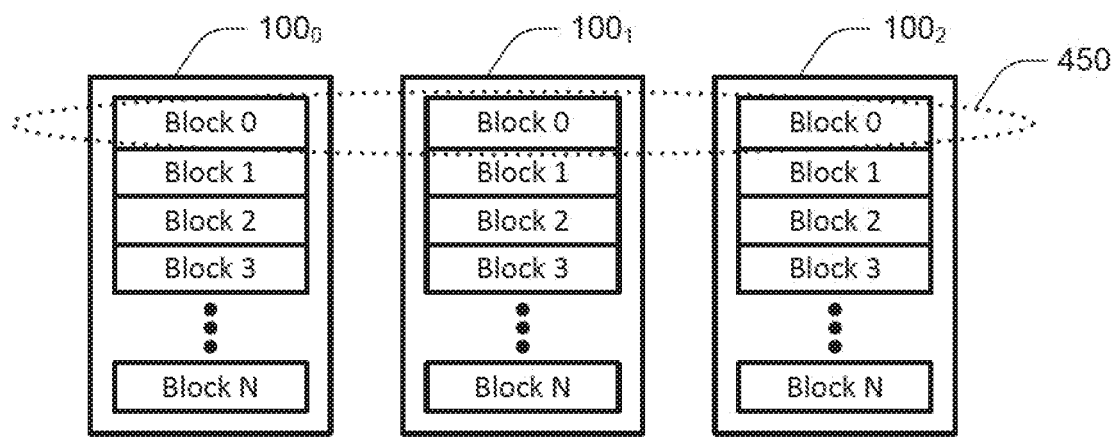
FIG. 4 is a representation of blocks of memory cells for use with embodiments.

FIG. 4 is a representation of blocks of memory cells for use with embodiments. As depicted in FIG. 4, each memory device 100 might include multiple blocks of memory cells, e.g., each containing Blocks 0-N. Blocks of memory cells of multiple memory devices, e.g., Blocks 0 for each memory device $100_0$, $100_1$ and $100_2$, might be logically combined to define a super block of memory cells 450. A super block of memory cells 450 might be formed for each corresponding block of memory cells (e.g., blocks of memory cells sharing the same logical address within their respective memory device 100) of the memory devices 100. For example, Blocks 1 for each memory device 100 might be logically combined to define a super block of memory cells, Blocks 2 for each memory device 100 might be logically combined to define a super block of memory cells, Blocks 3 for each memory device 100 might be logically combined to define a super block of memory cells, etc. Although super block of memory cells 450 is depicted to include a block of memory cells from each of three memory devices 100, a super block could include blocks of memory cells from some other number of memory devices 100.

The page of memory cells 300 might represent a logical page of memory cells of a single block of memory cells 250 (e.g., of FIG. 2C), or it might represent a logical page of memory cells of more than one block of memory cells, e.g., a super block of memory cells 450. Furthermore, a page of memory cells 300 representing a logical page of memory cells of the super block of memory cells 450 might contain user data and overhead data in each block of memory cells (e.g., Block 0 of memory device $100_0$, Block 0 of memory device $100_1$, and Block 0 of memory device $100_2$), or it might contain user data and/or overhead data in only a subset of the blocks of memory cells of the super block of memory cells 450. For example, user data of a page of memory cells 300 of the super block of memory cells 450 might be stored in Block 0 of memory device $100_0$, Block 0 of memory device $100_1$, and Block 0 of memory device $100_2$, but overhead data of that page of memory cells 300 might only be stored to Block 0 of memory device $100_2$.

Figure 5B:
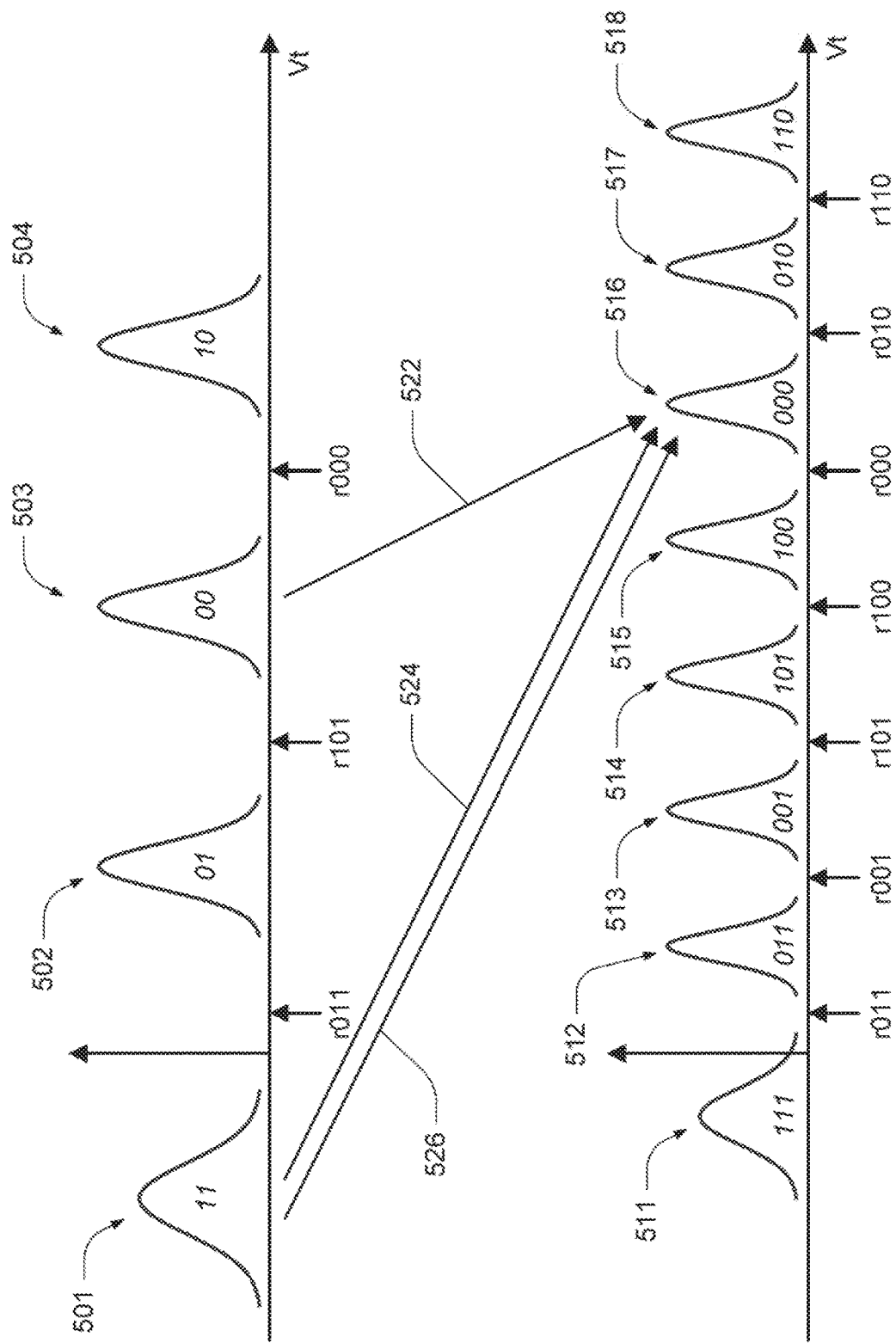

FIGS. 5A-5B depict representations of populations of memory cells at various stages of a programming operation according to an embodiment. FIG. 5A may represent a first pass of a programming operation for a TLC memory, e.g., having final data states each representing three digits of information. FIG. 5B may represent a second pass of the programming operation for a TLC memory.

FIG. 5A includes a population of memory cells 500 having an initial threshold voltage range. For example, the memory cells of a page of memory cells might be erased to each have a threshold voltage below a read voltage (e.g., a lowest read voltage) r011, and representing an erased data state. The first pass of a programming operation for a TLC memory might involve loading lower page data, programming that lower page data, loading upper page data and programming that upper page data. As a result, the population of memory cells 500 might be programmed to their respective desired data states corresponding to a population of memory cells 501 representing a first data state, a population of memory cells 502 representing a second data state, a population of memory cells 503 representing a third data state, and a population of memory cells 504 representing a fourth data state. The population of memory cells 501 might represent a logical data value of '11', the population of memory cells 502 might represent a logical data value of '01', the population of memory cells 503 might represent a logical data value of '00', and the population of memory cells 504 might represent a logical data value of '10', where the right-most digit might represent the lower page data for a memory cell having a threshold voltage within the threshold voltage range of its respective population of memory cells and the left-most digit might represent the upper page data for that memory cell. Although a specific example of binary representation is provided, embodiments may use other arrangements of bit patterns to represent the various data states.

A memory cell of the population of memory cells 500 configured for storage of overhead data (e.g., a memory cell corresponding to flag $314_2$ of FIG. 3) might be programmed to have a threshold voltage within the threshold voltage range corresponding to a particular one of the four data states during the first pass of the programming operation. For example, as depicted by line 520, a memory cell of the population of memory cells 500 might have a desired data state corresponding to the population of memory cells 503, e.g., a '00' logical data value, for the first pass of the programming operation. Certain other memory cells of the population of memory cells 500 configured for storage of overhead data (e.g., memory cells corresponding to flags $314_1$ and $314_3$ of FIG. 3) might be inhibited from programming during the first pass of the programming operation, e.g., their desired data states might correspond to the population of memory cells 501, e.g., a '11' logical data value, for the first pass of the programming operation. In this manner, memory cells corresponding to flags $314_1$ and $314_3$ of FIG. 3 each having the data state corresponding to the population of memory cells 501, e.g., a '11' logical data value, and the memory cell corresponding to flag $314_2$ of FIG. 3 having the data state corresponding to the population of memory cells 503, e.g., a '00' logical data value, can indicate to the memory that the first pass of the programming operation has been performed normally.

As is understood in the art, data states of memory cells within the populations of memory cells 501-504 may be determined by applying the read voltages r011, r101 and r000 and sensing for activation of the memory cells at the respective voltages. For example, memory cells activated in response to read voltage r011 would have the first data state, any remaining memory cells activated in response to read voltage r101 would have the second data state, any remaining memory cells activated in response to read voltage r000 would have the third data state, and any remaining memory cells not activated in response to read voltage r000 would have the fourth data state.

FIG. 5B includes the populations of memory cells 501-504 discussed with reference to FIG. 5A resulting from the first pass of a programming operation for a TLC memory. The second pass of the programming operation for a TLC memory might involve loading extra page data and programming that extra page data based on knowledge of the current data state of the memory cell, such as by re-loading the prior data or reading the memory cell. As a result, the population of memory cells 501 might be programmed to their respective desired data states corresponding to a population of memory cells 511 representing a first data state, and a population of memory cells 512 representing a second data state; the population of memory cells 502 might be programmed to their respective desired data states corresponding to a population of memory cells 513 representing a third data state, and a population of memory cells 514 representing a fourth data state; the population of memory cells 503 might be programmed to their respective desired data states corresponding to a population of memory cells 515 representing a fifth data state, and a population of memory cells 516 representing a sixth data state; and the population of memory cells 504 might be programmed to their respective desired data states corresponding to a population of memory cells 517 representing a seventh data state, and a population of memory cells 518 representing a eighth data state.

The population of memory cells 511 might represent a logical data value of '111', the population of memory cells 512 might represent a logical data value of '011', the population of memory cells 513 might represent a logical data value of '001', the population of memory cells 514 might represent a logical data value of '101', the population of memory cells 515 might represent a logical data value of '100', the population of memory cells 516 might represent a logical data value of '000', the population of memory cells 517 might represent a logical data value of '010', and the population of memory cells 518 might represent a logical data value of '110', where the right-most digit might represent the lower page data for a memory cell having a threshold voltage within the threshold voltage range of its respective population of memory cells, the center digit might represent the upper page data for that memory cell, and the left-most digit might represent the extra page data for that memory cell. As is understood in the art, data states of memory cells within the populations of memory cells 511-518 may be determined by applying the read voltages r011, r001, r101, r100, r000, r010 and r110 and sensing for activation of the memory cells at the respective voltages in a manner similar to that discussed with reference to FIG. 5A. Although a specific example of binary representation is provided, embodiments may use other arrangements of bit patterns to represent the various data states.

A memory cell of the population of memory cells 503 configured for storage of overhead data (e.g., the memory cell corresponding to flag 314₂ of FIG. 3), might be programmed to have a threshold voltage within the threshold voltage range corresponding to a particular one of the eight data states during the second pass of the programming operation. For example, as depicted by line 522, a memory cell of the population of memory cells 503, e.g., a '00' logical data value, might have a desired data state corresponding to the population of memory cells 516, e.g., a '000' logical data value, for the second pass of the programming operation. A memory cell of the population of memory cells 501, e.g., a '11' logical data value, configured for storage of overhead data (e.g., the memory cell corresponding to flag 314₃ of FIG. 3) might also be programmed to have a threshold voltage within the threshold voltage range corresponding to a particular one of the eight data states during the second pass of the programming operation. For example, as depicted by line 524, a memory cell of the population of memory cells 501, e.g., a '11' logical data value, might have a desired data state corresponding to the population of memory cells 516, e.g., a '000' logical data value, for the second pass of the programming operation. A particular memory cell of the population of memory cells 501 configured for storage of overhead data (e.g., the memory cell corresponding to flag 314₁ of FIG. 3) might be initially inhibited from programming during the second pass of the programming operation, e.g., its desired data state might initially correspond to the population of memory cells 511, e.g., a '111' logical data value, for the second pass of the programming operation under normal operation. In this manner, the memory cell corresponding to flag 314₁ of FIG. 3 having the data state corresponding to the population of memory cells 511, e.g., a '111' logical data value, and the memory cells corresponding to flags 314₂ and 314₃ of FIG. 3 each having the data state corresponding to the population of memory cells 516, e.g., a '000' logical data value, upon completion of the programming operation, can indicate to the memory that the second pass of the programming operation has been performed normally, e.g., in the absence of an indication of power loss.

If a power loss is indicated, e.g., during the second pass of the programming operation, an indication can be generated within the memory to document the event. A power loss might be indicated by a control signal received by the memory. For example, a control signal normally expected to be logic high during the programming operation, such as a write protect (WP#) control signal, might toggle to logic low if the controller providing that control signal loses power. In this case, the transition of the control signal to logic low could be deemed an indication of a power loss to the memory. To document the power loss when a power loss is indicated (e.g., deemed to have occurred), a desired data state of a particular memory cell of the page of memory cells currently undergoing the programming operation might be changed for the remainder of the programming operation, e.g., completing the programming operation using power from the hold-up capacitance 138 or other energy storage device. As such, that memory cell would be expected to have a particular data state under normal operation, e.g., a '111' logical data value, and would be expected to have a different data state if a power loss is indicated, e.g., a '000' logical data value.

For example, the particular memory cell of the population of memory cells 501, e.g., a '11' logical data value, configured for storage of overhead data (e.g., the memory cell corresponding to flag 314₁ of FIG. 3) that was initially inhibited from programming during the second pass of the programming operation might have its desired data state changed from an expected data state for normal operation (e.g., the data state corresponding to the population of memory cells 511, e.g., a '111' logical data value) to a different data state (e.g., the data state corresponding to the population of memory cells 516, e.g., a '000' logical data value) for the remainder of the second pass of the programming operation. For example, as depicted by line 526, a particular memory cell of the population of memory cells 501, e.g., a '11' logical data value, might have a desired data state corresponding to the population of memory cells 516, e.g., a '000' logical data value, for a portion of (e.g., only a portion of) the second pass of the programming operation if a power loss is indicated. In this manner, the memory cells corresponding to flags 314₁, 314₂ and 314₃ of FIG. 3 each having the data state corresponding to the population of memory cells 516, e.g., a '000' logical data value, can indicate to the memory that the second pass of the programming operation has been performed, but that it was completed after a power loss was indicated. It will be apparent that the data state corresponding to the flag 314₁ of this example might individually indicate that a power loss was indicated, regardless of whether the second pass of the programming operation was completed. In view of the foregoing example, if the data state of the memory cell corresponding to the flag 314₁ does not correspond to the population of memory cells 511, e.g., a '111' logical data value, a power loss might be deemed to have occurred during the second pass of the programming operation, regardless of whether its data state reached the desired data state corresponding to the population of memory cells 516, e.g., a '000' logical data value. For example, even if the energy storage device did not have sufficient stored energy to complete the second pass of the programming operation following a power loss, the data state of the memory cell corresponding to the flag 314₁ might be expected to experience at least some shift in threshold voltage such that it may not activate in response to application of the r011 read voltage, thus providing the indication of power loss.

Figure 6:
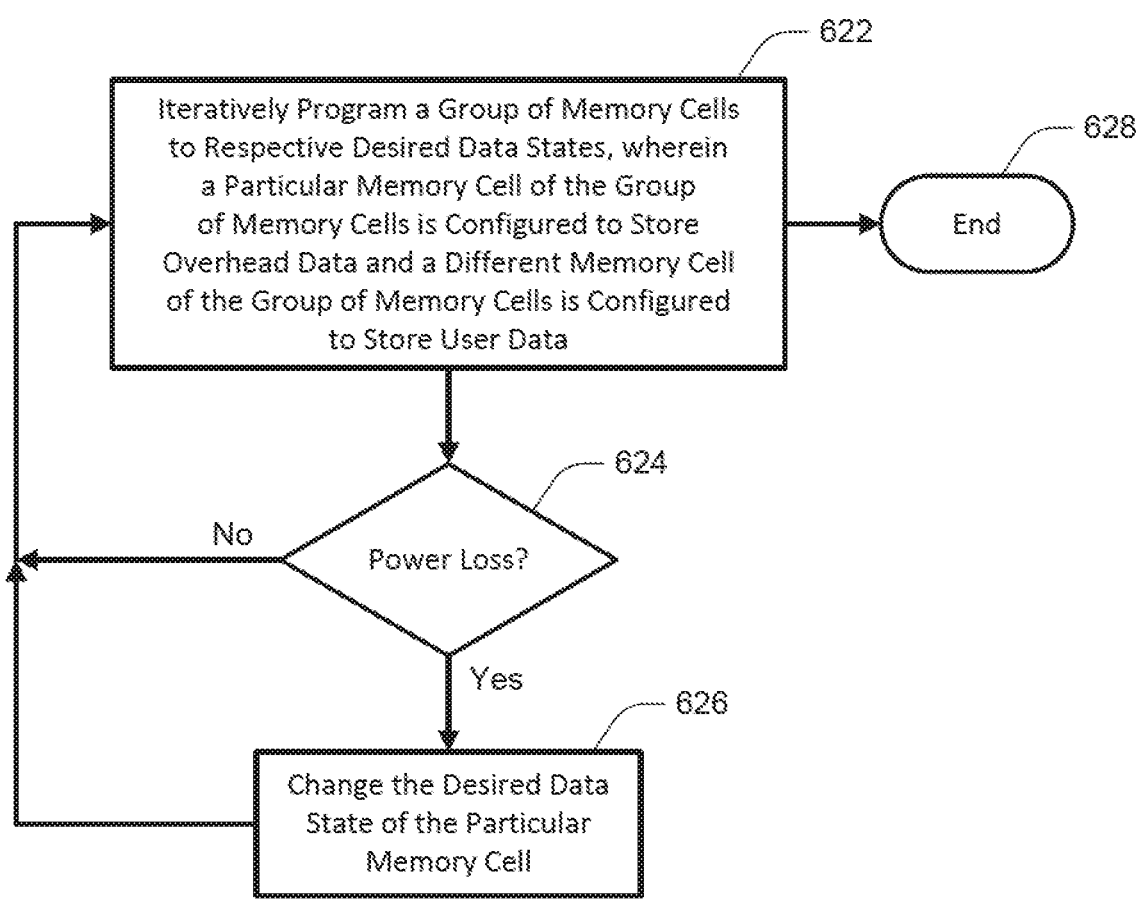
FIGS. 6-9 are flowcharts of methods of operating an apparatus according to embodiments.

FIG. 6 is a flowchart of a method of operating an apparatus (e.g., a memory) according to an embodiment. At 622, a group of memory cells are iteratively programmed to respective desired data states, wherein a particular memory cell of the group of memory cells is configured to store overhead data (e.g., a status indicator) and a different memory cell of the group of memory cells is configured to store user data. For example, a write command might be received by the apparatus and include data (e.g., user data) associated with that write command and received by the apparatus. The apparatus (e.g., a controller of the apparatus) might then generate data (e.g., overhead data) in response to the write command. In further response to the write command, the apparatus might initiate a programming operation to program the user data and overhead data to a group (e.g., a page) of memory cells that includes an iterative process to shift data states of respective memory cells from one data state (e.g., an initial or interim data state) to another data state (e.g., a desired data state). The particular memory cell of the group of memory cells initially might be inhibited from programming during the iterative process of 622, e.g., by applying a particular voltage level (e.g., inhibit voltage level) to a data line selectively connected to the particular memory cell and configured to mitigate a change in the threshold voltage of the particular memory cell in response to a programming pulse.

At 624, a determination is made whether a power loss is indicated during the iterative process of 622. If no power loss is indicated, the iterative process of 622 can continue. The determination of 624 might represent an interrupt to the iterative process of 622 responsive to a particular indication of power loss, e.g., a particular logic level of a control signal, or it might represent a periodic (e.g., once every iteration) check for an indication of power loss during the iterative process of 622. If a power loss is indicated at 624, the desired data state of the particular memory cell is changed prior to continuing with the iterative process of 622. This might further include changing a voltage level applied to the data line selectively connected to the particular memory cell from an inhibit voltage level to a voltage level (e.g., enable voltage level) configured to permit a change in the threshold voltage of the particular memory cell in response to a programming pulse, i.e., to enable rather than inhibit programming. Upon completion of the iterative process of 622, e.g., passing program verification for the memory cells of the group of memory cells or declaring a programming failure, the process can end at 628. The data state of the particular memory cell can indicate, in a non-volatile manner, whether a power loss occurred during programming of the group of memory cells. As noted previously, an energy storage device, such as capacitance 138 of FIGS. 1A-1B, might be used to supply a finite amount of power to the apparatus in order to seek to continue the iterative process of 622 even if a power loss has occurred.

Figure 7:
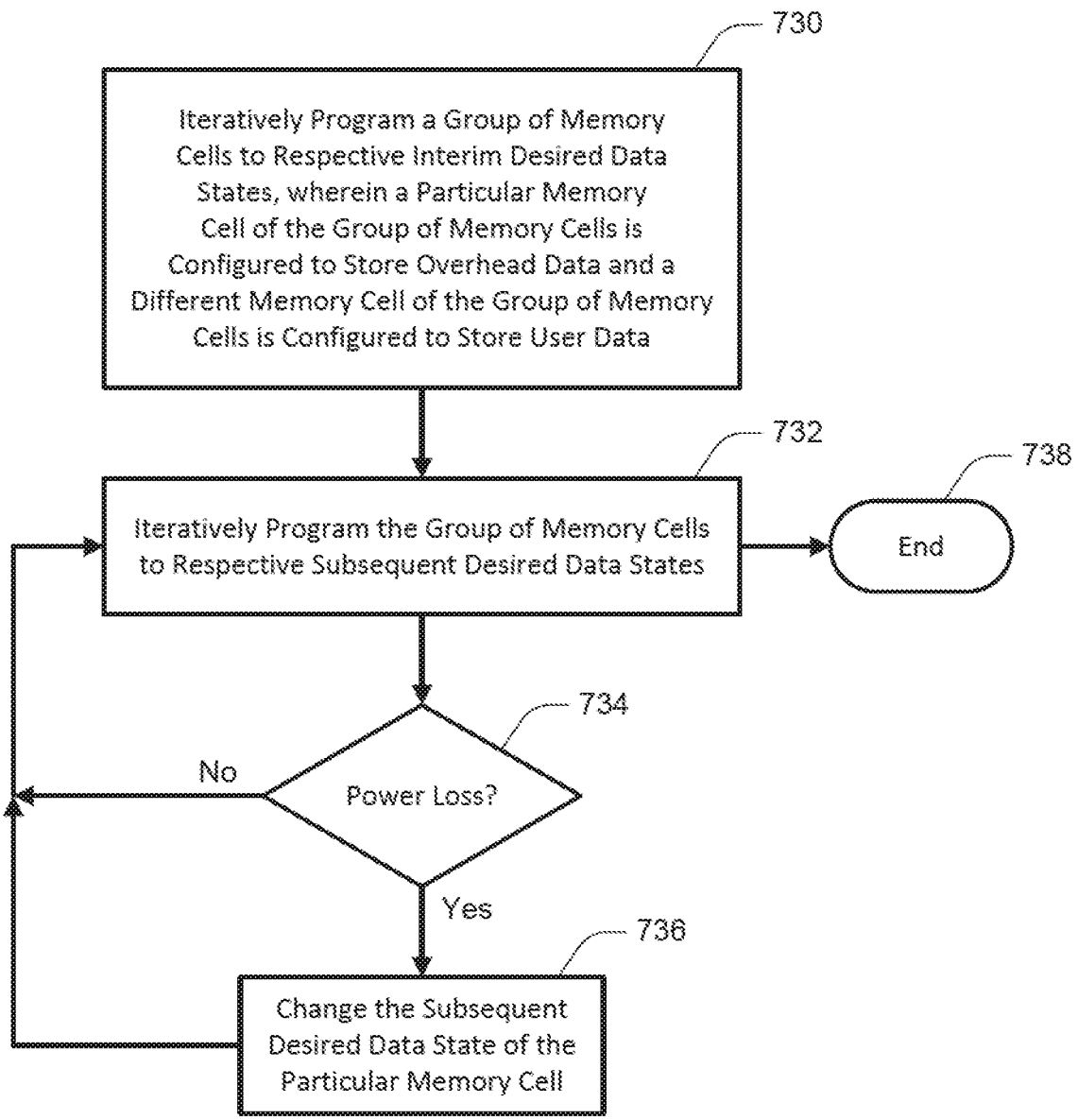

FIG. 7 is a flowchart of a method of operating an apparatus (e.g., a memory) according to another embodiment. FIG. 7 might represent the two-pass programming operation of TLC memory, for example. At 730, a group of memory cells are iteratively programmed to respective interim desired data states, wherein a particular memory cell of the group of memory cells is configured to store overhead data (e.g., a status indicator) and a different memory cell of the group of memory cells is configured to store user data. For example, a write command might be received by the apparatus and include data (e.g., user data) associated with that write command and received by the apparatus. The apparatus might then generate data (e.g., overhead data) in response to the write command. In further response to the write command, the apparatus might initiate a programming operation to program the user data and overhead data to a group (e.g., a page) of memory cells that includes an iterative process to shift data states of respective memory cells from one data state (e.g., an initial data state) to another data state (e.g., an interim desired data state). The iterative process of 730 might represent the first pass of a programming operation. The particular memory cell of the group of memory cells might be inhibited from programming during the iterative process of 730, e.g., by applying a particular voltage level (e.g., inhibit voltage level) to a data line selectively connected to the particular memory cell and configured to mitigate a change in the threshold voltage of the particular memory cell in response to a programming pulse.

Checking for an indication of power loss during the iterative process of 730 might not be performed. For example, in a two-pass programming operation of TLC memory, the host or other processor providing the write command might not commit the data of the first pass of the programming operation until the second pass of the programming operation has been initiated. Standard firmware can track this situation and ignore the data as invalid.

At 732, the group of memory cells are iteratively programmed to respective subsequent (e.g., final) desired data states. The iterative process of 732 might represent the second pass of a programming operation. The particular memory cell of the group of memory cells initially might be inhibited from programming during the iterative process of 732, e.g., by applying a particular voltage level (e.g., inhibit voltage level) to the data line selectively connected to the particular memory cell and configured to mitigate a change in the threshold voltage of the particular memory cell in response to a programming pulse.

At 734, a determination is made whether a power loss is indicated during the iterative process of 732. If no power loss is indicated, the iterative process of 732 can continue. The determination of 734 might represent an interrupt to the iterative process of 732 responsive to a particular indication of power loss, e.g., a particular logic level of a control signal, or it might represent a periodic (e.g., once every iteration) check for an indication of power loss during the iterative process of 732. If a power loss is indicated at 734, the subsequent desired data state of the particular memory cell is changed at 736 prior to continuing with the iterative process of 732. This might further include changing a voltage level applied to the data line selectively connected to the particular memory cell from an inhibit voltage level to a voltage level (e.g., enable voltage level) configured to permit a change in the threshold voltage of the particular memory cell in response to a programming pulse. Upon completion of the iterative process of 732, e.g., passing program verification on the memory cells of the group of memory cells or declaring a programming failure, the process can end at 738. The data state of the particular memory cell can indicate, in a non-volatile manner, whether a power loss occurred during programming of the group of memory cells during the second pass of the programming operation. As noted previously, an energy storage device, such as capacitance 138 of FIGS. 1A-1B, might be used to supply a finite amount of power to the apparatus in order to seek to continue the iterative process of 732 even if a power loss has occurred.

Figure 8:
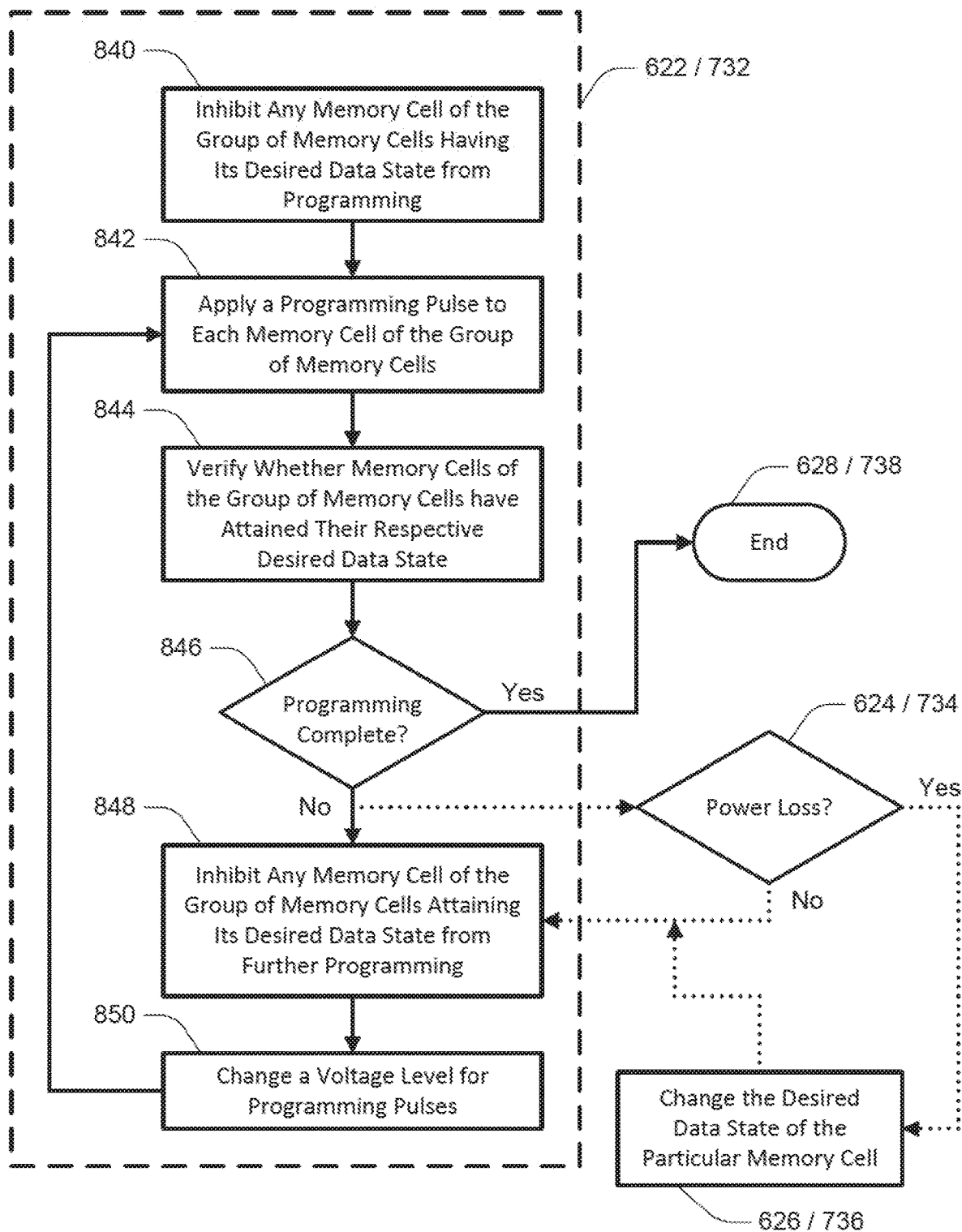

FIG. 8 is a flowchart of a method of operating an apparatus (e.g., a memory) according to another embodiment. FIG. 8 provides additional detail as to how the iterative processes of 622 (FIG. 6) and 732 (FIG. 7) might be performed. At 840, any memory cell of the group of memory cells having its desired data state for the iterative process of 622/732, is inhibited from programming. At 842, a programming pulse is applied to each memory cell of the group of memory cells. At 844, a verify (e.g., program verify) is performed to determine whether memory cells of the group of memory cells have attained their respective desired data states for the iterative process of 622/732 in response to the programming pulse of 842. At 846, a determination is made as to whether programming is complete, e.g., the memory cells of the group of memory cells have attained their respective desired data states or a failure condition has been declared. If programming is complete at 846, the process can end at 628/738. If programming is not complete at 846, any memory cell of the group of memory cells that attained its desired data state at 844 is inhibited from further programming at 848. A voltage level for programming pulses is changed (e.g., increased) at 850 and the process returns to 842.

At 624/734, a determination is made whether a power loss is indicated during the iterative process of 622/732. If no power loss is indicated, the iterative process of 622/732 can continue. The determination of 624/734 might represent an interrupt to the iterative process of 622/732 responsive to a particular indication of power loss, e.g., a particular logic level of a control signal. Alternatively, the determination of 624/734 might represent a periodic (e.g., once every iteration) check for an indication of power loss during the iterative process of 622/734, such as once after determining at 846 whether programming is complete. If a power loss is indicated at 624/734, the desired data state of the particular memory cell is changed at 626/736 prior to continuing with the iterative process of 622, e.g., prior to proceeding to 848. This might further include enabling (e.g., re-enabling) programming of the particular memory cell. Upon completion of the iterative process of 622/734, e.g., passing program verification on the memory cells of the group of memory cells at 844 or declaring a programming failure, the process can end at 628/738. The data state of the particular memory cell can indicate, in a non-volatile manner, whether a power loss occurred during programming of the group of memory cells. As noted previously, an energy storage device, such as capacitance 138 of FIGS. 1A-1B, might be used to supply a finite amount of power to the apparatus in order to seek to continue the iterative process of 622/732 even if a power loss has occurred.

Figure 9:
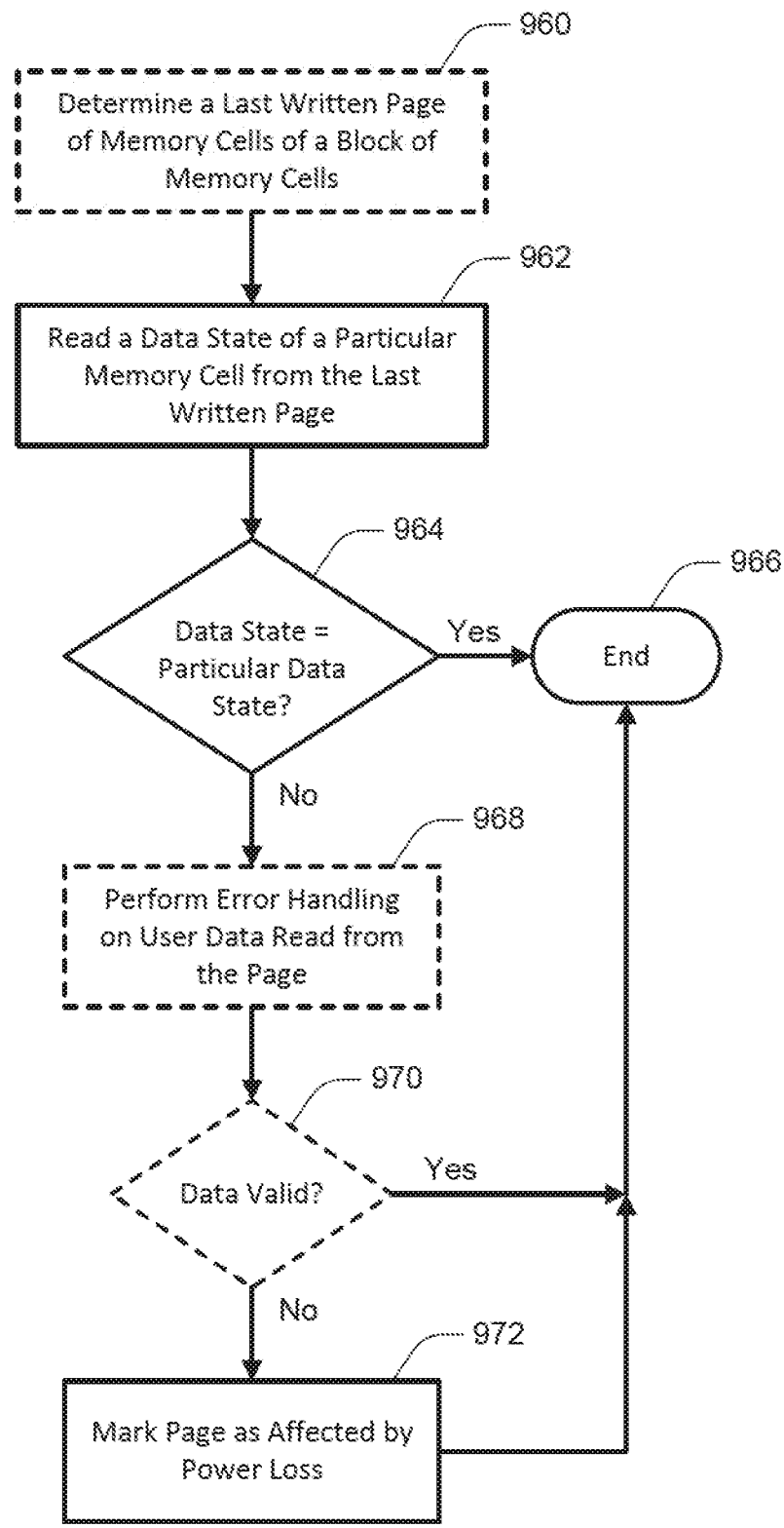

FIG. 9 is a flowchart of a method of operating an apparatus (e.g., a memory) in accordance with an embodiment. The method of FIG. 9 might be performed, for example, if a system flag or other indicator indicates that the apparatus or its host had an uncontrolled shut-down. The method of FIG. 9 might be performed for one or more blocks of memory cells of the apparatus.

At 960, a determination may be made of a last written page of memory cells of a block of memory cells. At 962, a particular memory cell (e.g., corresponding to a status indicator) from the last written page of memory cells is read to determine its data state. Reading the particular memory cell for data output may not be available during normal operation of the apparatus. For example, the status indicator may only be available to a particular controller (e.g., an internal controller) of a memory performing a programming operation on the page of memory cells. However, activating a feature to permit reading such a memory cell is well understood in the art.

At 964, a determination is made whether the data state of the memory cell is a particular data state. If the data state of the memory cell is the particular data state at 964, the process can end at 966. If the data state of the memory cell is not the particular data state at 964, the page of memory cells can be marked as affected by power loss at 972. For example, mapping information can be updated to indicate the status of the page of memory cells. Optionally, if the data state of the status indicator is not the particular data state at 964, the method may further include performing error handling on user data read from the page of memory cells. If the data is valid at 970, the process might end at 966 without marking the page of memory cells as affected by power loss at 972.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
   an array of memory cells; and
   a controller to perform access operations on the array of memory cells;
   wherein the controller is configured to:
      read a particular memory cell of a last written page of memory cells of a block of memory cells of the array of memory cells;
      determine whether a threshold voltage of the particular memory cell is less than a particular voltage level; and
      mark the last written page of memory cells as affected by power loss during a programming operation of the last written page of memory cells in response to determining that the threshold voltage of the particular memory cell is higher than the particular voltage level regardless of a threshold voltage of any remaining memory cell of the last written page of memory cells.

2. The apparatus of claim 1, wherein the particular voltage level is configured to activate a memory cell of the last written page of memory cells having an erased data state.

3. The apparatus of claim 1, wherein the controller is further configured to:
   read respective data states of the memory cells of the last written page of memory cells, including memory cells configured to store user data and memory cells configured to store error correction code for the user data; and
   perform error handling on the user data using the error correction code for the user data.

4. The apparatus of claim 3, further comprising:
   mark the last written page of memory cells as affected by power loss only if performing the error handling on the user data fails to correct any errors detected in the user data.

5. The apparatus of claim 1, wherein the controller is further configured to:
   determine that the last written page of memory cells was programmed normally if the threshold voltage of the particular memory cell is less than the particular voltage level.

6. The apparatus of claim 5, wherein the controller is further configured to:
   determine that the last written page of memory cells was programmed normally if the threshold voltage of the particular memory cell is equal to the particular voltage level.

7. An apparatus, comprising:
   an array of memory cells; and
   a controller to perform access operations on the array of memory cells;
   wherein, when a system flag of the apparatus indicates that the apparatus had an uncontrolled shut-down, the controller is configured to:
      read a particular memory cell of a last written page of memory cells of a block of memory cells of the array of memory cells;
      determine whether a threshold voltage of the particular memory cell is less than a particular voltage level;
      perform error handling on the last written page of memory cells in response to determining that the threshold voltage of the particular memory cell is higher than the particular voltage level; and mark the last written page of memory cells as affected by power loss during a programming operation of the last written page of memory cells when the error handling fails to correct any errors detected in user data stored in the last written page of memory cells.

8. The apparatus of claim 7, wherein the controller is further configured to:
if the threshold voltage of the particular memory cell is determined to be higher than the particular voltage level, read respective data states of the memory cells of the last written page of memory cells, including memory cells configured to store the user data and memory cells configured to store error correction code for the user data; and
perform the error handling on the user data using the error correction code for the user data.

9. The apparatus of claim 7, wherein the controller being configured to determine whether the threshold voltage of the particular memory cell is less than the particular voltage level comprises the controller being configured to determine whether the threshold voltage of the particular memory cell is less than or equal to the particular voltage level.

10. The apparatus of claim 7, wherein the controller is further configured to perform the error handling when the threshold voltage of the particular memory cell is determined to be higher than the particular voltage level.

11. An apparatus, comprising:
an array of memory cells; and
a controller to perform access operations on the array of memory cells;
wherein, when a system flag of the apparatus indicates that the apparatus had an uncontrolled shut-down, the controller is configured to:
read a particular memory cell of a last written page of memory cells of a block of memory cells of the array of memory cells;
determine whether a threshold voltage of the particular memory cell is less than a particular voltage level; and
mark the last written page of memory cells as affected by power loss during a programming operation of the last written page of memory cells when error handling fails to correct any errors detected in user data stored in the last written page of memory cells;
wherein the controller being configured to determine whether the threshold voltage of the particular memory cell is less than the particular voltage level comprises the controller being configured to determine whether a data state of the particular memory cell corresponds to a lowest data state of a plurality of possible programmed data states used to program the last written page of memory cells.

12. An apparatus, comprising:
an array of memory cells; and
a controller to perform access operations on the array of memory cells;
wherein, when a system flag of the apparatus indicates that the apparatus had an uncontrolled shut-down, the controller is configured to:
read a particular memory cell of a last written page of memory cells of a block of memory cells of the array of memory cells;
determine whether a threshold voltage of the particular memory cell is less than a particular voltage level, wherein the particular voltage level is configured to activate a memory cell of the last written page of memory cells having a particular data state of a plurality of possible programmed data states used by the controller for programming the last written page of memory cells; and
if the threshold voltage of the particular memory cell is determined to be higher than the particular voltage level, mark the last written page of memory cells as affected by power loss during a programming operation of the last written page of memory cells when error handling fails to correct any errors detected in user data stored in the last written page of memory cells.

13. The apparatus of claim 12, wherein the particular data state is a lowest data state of the plurality of possible programmed data states.

14. The apparatus of claim 12, wherein the particular voltage level is a lowest read voltage of a plurality of read voltages used by the controller for reading data states of memory cells of the last written page of memory cells.

15. The apparatus of claim 12, wherein the controller is further configured to:
read respective data states, of the plurality of possible programmed data states, of the memory cells of the last written page of memory cells, including memory cells configured to store user data and memory cells configured to store error correction code for the user data; and
perform the error handling on the user data using the error correction code for the user data.

16. The apparatus of claim 15, wherein the controller is further configured to:
mark the last written page of memory cells as affected by power loss only if the user data is deemed invalid after performing the error handling on the user data.

17. The apparatus of claim 12, wherein the controller is further configured to:
determine that the last written page of memory cells was programmed normally if the threshold voltage of the particular memory cell is less than or equal to the particular voltage level.

18. The apparatus of claim 12, wherein the controller being configured to determine whether the threshold voltage of the particular memory cell is less than the particular voltage level comprises the controller being configured to determine whether a data state of the particular memory cell corresponds to the particular data state.

19. The apparatus of claim 12, wherein reading the particular memory cell for data output is unavailable during normal operation of the apparatus.

20. The apparatus of claim 12, wherein the apparatus is a solid state drive, and the array of memory cells is contained in a memory device of the solid state drive.

* * * * *